US012640460B2

(12) United States Patent
Yen

(10) Patent No.: US 12,640,460 B2
(45) Date of Patent: May 26, 2026

(54) SEMICONDUCTOR PACKAGE INCLUDING ANTENNA SUBSTRATE AND MANUFACTURING METHOD THEREOF

(71) Applicant: Advanced Semiconductor Engineering, Inc., Kaohsiung (TW)

(72) Inventor: Han-Chee Yen, Taipei City (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 449 days.

(21) Appl. No.: 18/203,632

(22) Filed: May 30, 2023

(65) Prior Publication Data

US 2023/0299462 A1      Sep. 21, 2023

Related U.S. Application Data

(63) Continuation of application No. 15/826,543, filed on Nov. 29, 2017, now Pat. No. 11,664,580, which is a
(Continued)

(51) Int. Cl.
| | |
|---|---|
| *H01Q 1/22* | (2006.01) |
| *H01Q 9/04* | (2006.01) |
| *H10W 44/20* | (2026.01) |
| *H10W 74/10* | (2026.01) |
| *H10W 90/00* | (2026.01) |
(Continued)

(52) U.S. Cl.
CPC ......... *H01Q 1/2283* (2013.01); *H01Q 9/0407* (2013.01); *H10W 44/20* (2026.01); *H10W 74/117* (2026.01); *H10W 90/00* (2026.01); *H10W 44/248* (2026.01); *H10W 72/0198* (2026.01); *H10W 72/29* (2026.01); *H10W*

*72/59* (2026.01); *H10W 72/877* (2026.01); *H10W 72/879* (2026.01); *H10W 72/90* (2026.01); *H10W 74/00* (2026.01);
(Continued)

(58) Field of Classification Search
None
See application file for complete search history.

(56) References Cited

U.S. PATENT DOCUMENTS

| | | | |
|---|---|---|---|
| 4,040,060 A | 8/1977 | Kaloi | |
| 4,814,205 A | 3/1989 | Arcilesi et al. | |
(Continued)

FOREIGN PATENT DOCUMENTS

| | | |
|---|---|---|
| CN | 1627562 A | 6/2005 |
| CN | 1716695 A | 1/2006 |
(Continued)

OTHER PUBLICATIONS

Chun-Hsiang Huang, Chih-Ying Hsiao, Chuen-De Wang, Tanny Chen, Liao Kuo-Hsien, Tzong-Lin Wu, "Conformal Shielding Investigation for SiP Modules", 2010 IEEE Electrical Design of Advanced Package & Systems Symposium, Dec. 2010.
(Continued)

*Primary Examiner* — Crystal L Hammond
(74) *Attorney, Agent, or Firm* — Foley and Lardner LLP

(57) ABSTRACT

A semiconductor package includes: (1) a package substrate including an upper surface; (2) a semiconductor device disposed adjacent to the upper surface of the package substrate, the semiconductor device including an inactive surface; and (3) an antenna substrate disposed on the inactive surface of the semiconductor device.

20 Claims, 10 Drawing Sheets

Related U.S. Application Data continuation of application No. 13/783,840, filed on Mar. 4, 2013, now Pat. No. 9,837,701.

(51) Int. Cl.

| | |
|---|---|
| *H10W 72/00* | (2026.01) |
| *H10W 72/29* | (2026.01) |
| *H10W 72/59* | (2026.01) |
| *H10W 72/90* | (2026.01) |
| *H10W 74/00* | (2026.01) |
| *H10W 74/01* | (2026.01) |

(52) U.S. Cl.
CPC ........ *H10W 74/014* (2026.01); *H10W 90/722* (2026.01); *H10W 90/724* (2026.01); *H10W 90/754* (2026.01)

(56) References Cited

U.S. PATENT DOCUMENTS

| | | | |
|---|---|---|---|
| 5,019,829 | A | 5/1991 | Heckman et al. |
| 5,166,772 | A | 11/1992 | Soldner et al. |
| 5,353,498 | A | 10/1994 | Fillion et al. |
| 5,355,016 | A | 10/1994 | Swirbel et al. |
| 5,557,142 | A | 9/1996 | Gilmore et al. |
| 5,639,989 | A | 6/1997 | Higgins, III |
| 5,677,511 | A | 10/1997 | Taylor et al. |
| 5,694,300 | A | 12/1997 | Mattei et al. |
| 5,776,798 | A | 7/1998 | Quan et al. |
| 5,886,876 | A | 3/1999 | Yamaguchi |
| 5,895,229 | A | 4/1999 | Carney et al. |
| 5,998,867 | A | 12/1999 | Jensen et al. |
| 6,093,972 | A | 7/2000 | Carney et al. |
| 6,150,193 | A | 11/2000 | Glenn |
| 6,225,694 | B1 | 5/2001 | Terui |
| 6,614,102 | B1 | 9/2003 | Hoffman et al. |
| 6,686,649 | B1 | 2/2004 | Mathews et al. |
| 6,740,959 | B2 | 5/2004 | Alcoe et al. |
| 6,757,181 | B1 | 6/2004 | Villanueva et al. |
| 6,781,231 | B2 | 8/2004 | Minervini |
| 6,818,978 | B1 | 11/2004 | Fan |
| 6,865,084 | B2 | 3/2005 | Lin et al. |
| 6,881,896 | B2 | 4/2005 | Ebihara |
| 6,917,526 | B2 | 7/2005 | Ajioka et al. |
| 6,933,597 | B1 | 8/2005 | Poddar et al. |
| 6,962,869 | B1 | 11/2005 | Bao et al. |
| 6,998,532 | B2 | 2/2006 | Kawamoto et al. |
| 7,030,469 | B2 | 4/2006 | Mahadevan et al. |
| 7,042,398 | B2 | 5/2006 | Tang et al. |
| 7,045,385 | B2 | 5/2006 | Kim et al. |
| 7,049,682 | B1 | 5/2006 | Mathews et al. |
| 7,081,661 | B2 | 7/2006 | Takehara et al. |
| 7,109,410 | B2 | 9/2006 | Arnold et al. |
| 7,119,745 | B2 | 10/2006 | Gaucher et al. |
| 7,125,744 | B2 | 10/2006 | Takehara et al. |
| 7,129,422 | B2 | 10/2006 | Arnold |
| 7,161,252 | B2 | 1/2007 | Tsuneoka et al. |
| 7,180,012 | B2 | 2/2007 | Tsuneoka et al. |
| 7,187,060 | B2 | 3/2007 | Usui |
| 7,214,889 | B2 | 5/2007 | Mazurkiewicz |
| 7,327,015 | B2 | 2/2008 | Yang et al. |
| 7,342,303 | B1 | 3/2008 | Berry et al. |
| 7,444,734 | B2 | 11/2008 | Gaucher et al. |
| 7,451,539 | B2 | 11/2008 | Morris et al. |
| 7,478,474 | B2 | 1/2009 | Koga |
| 7,479,407 | B2 | 1/2009 | Gehman et al. |
| 7,488,903 | B2 | 2/2009 | Kawagishi et al. |
| 7,504,721 | B2 | 3/2009 | Chen et al. |
| 7,576,415 | B2 | 8/2009 | Cha et al. |
| 7,598,616 | B2 | 10/2009 | Yang et al. |
| 7,615,856 | B2 | 11/2009 | Sakai et al. |
| 7,629,674 | B1 | 12/2009 | Foster |
| 7,633,170 | B2 | 12/2009 | Yang et al. |
| 7,633,765 | B1 | 12/2009 | Scanlan et al. |
| 7,656,047 | B2 | 2/2010 | Yang et al. |
| 7,700,411 | B2 | 4/2010 | Yang et al. |
| 7,745,910 | B1 | 6/2010 | Olson et al. |
| 7,808,439 | B2 | 10/2010 | Yang et al. |
| 7,829,981 | B2 | 11/2010 | Hsu |
| 7,851,893 | B2 | 12/2010 | Kim et al. |
| 7,872,343 | B1 | 1/2011 | Berry |
| 7,944,038 | B2 | 5/2011 | Chiu et al. |
| 7,989,928 | B2 | 8/2011 | Liao et al. |
| 8,018,033 | B2 | 9/2011 | Moriya |
| 8,022,511 | B2 | 9/2011 | Chiu et al. |
| 8,030,750 | B2 | 10/2011 | Kim et al. |
| 8,058,714 | B2 | 11/2011 | Noll et al. |
| 8,061,012 | B2 | 11/2011 | Carey et al. |
| 8,093,690 | B2 | 1/2012 | Ko et al. |
| 8,110,902 | B2 | 2/2012 | Eun et al. |
| 8,186,048 | B2 | 5/2012 | Leahy et al. |
| 8,212,339 | B2 | 7/2012 | Liao et al. |
| 8,759,950 | B2 | 6/2014 | Kamgaing et al. |
| 8,803,315 | B2 | 8/2014 | Takizawa et al. |
| 2004/0150097 | A1 | 8/2004 | Gaynes et al. |
| 2005/0029673 | A1 | 2/2005 | Naka et al. |
| 2005/0039946 | A1 | 2/2005 | Nakao |
| 2007/0029667 | A1 | 2/2007 | Fujii et al. |
| 2007/0063056 | A1 | 3/2007 | Gaucher et al. |
| 2008/0174013 | A1 | 7/2008 | Yang et al. |
| 2009/0000114 | A1 | 1/2009 | Rao et al. |
| 2009/0000815 | A1 | 1/2009 | Hiner et al. |
| 2009/0000816 | A1 | 1/2009 | Hiner et al. |
| 2009/0002969 | A1 | 1/2009 | Madsen et al. |
| 2009/0002971 | A1 | 1/2009 | Carey et al. |
| 2009/0025211 | A1 | 1/2009 | Hiner et al. |
| 2009/0035895 | A1 | 2/2009 | Lee et al. |
| 2009/0102003 | A1 | 4/2009 | Vogt et al. |
| 2009/0102033 | A1 | 4/2009 | Raben |
| 2009/0194851 | A1 | 8/2009 | Chiu et al. |
| 2009/0194852 | A1 | 8/2009 | Chiu et al. |
| 2009/0230487 | A1 | 9/2009 | Saitoh et al. |
| 2009/0256244 | A1 | 10/2009 | Liao et al. |
| 2010/0032815 | A1 | 2/2010 | An et al. |
| 2010/0110656 | A1 | 5/2010 | Ko et al. |
| 2010/0199492 | A1 | 8/2010 | Hiner et al. |
| 2010/0207257 | A1 | 8/2010 | Lee |
| 2011/0115060 | A1 | 5/2011 | Chiu et al. |
| 2011/0127654 | A1 | 6/2011 | Weng et al. |
| 2012/0062439 | A1 | 3/2012 | Liao et al. |
| 2013/0078915 | A1 | 3/2013 | Zhao et al. |
| 2014/0008773 | A1 | 1/2014 | Yen et al. |
| 2014/0028518 | A1 | 1/2014 | Arnold et al. |
| 2020/0020653 | A1* | 1/2020 | Lim ...................... H01Q 1/243 |

FOREIGN PATENT DOCUMENTS

| | | |
|---|---|---|
| CN | 102044532 A | 5/2011 |
| CN | 102299142 A | 12/2011 |
| CN | 102324416 A | 1/2012 |
| CN | 202434508 U | 9/2012 |
| CN | 103554803 A | 1/2014 |
| JP | 08-288686 | 11/1996 |
| WO | WO-2004/060034 A1 | 7/2004 |

OTHER PUBLICATIONS

Non-Final Office Action for U.S. Appl. No. 15/826,543, issued Jun. 19, 2020, 14 pages.

Non-Final Office Action for U.S. Appl. No. 15/826,543, issued Sep. 2, 2021, 17 pages.

Notice of Allowance for U.S. Appl. No. 15/826,543, filed Jan. 25, 2023, 7 pages.

Office Action for corresponding Chinese Patent Application No. 201713342215.5, issued on Dec. 18, 2019, 8 pages.

Office Action for corresponding Chinese Patent Application No. 201713342215.5, issued on Oct. 9, 2019, 6 pages (with English translation).

Non-Final Office Action for U.S. Appl. No. 13/783,840, issued Jan. 5, 2015.

Final Office Action for U.S. Appl. No. 13/783,840, issued Jul. 1, 2015.

(56)          References Cited

OTHER PUBLICATIONS

Non-Final Office Action for U.S. Appl. No. 13/783,840, issued Dec. 8, 2015.
Final Office Action for U.S. Appl. No. 13/783,840, issued Jul. 12, 2016.
Non-Final Office Action for U.S. Appl. No. 13/783,840, issued Jun. 5, 2017.
Notice of Allowance for U.S. Appl. No. 13/783,840, issued Oct. 5, 2017.

* cited by examiner

SEMICONDUCTOR PACKAGE INCLUDING ANTENNA SUBSTRATE AND MANUFACTURING METHOD THEREOF

CROSS-REFERENCE TO RELATED APPLICATION

The present application is a continuation of and claims priority to U.S. patent application Ser. No. 15/826,543, filed on Nov. 29, 2017, which is a continuation of and claims priority to U.S. application Ser. No. 13/783,840, filed on Mar. 4, 2013, now U.S. Pat. No. 9,837,701, the contents of which are incorporated by reference herein in their entireties.

BACKGROUND OF THE INVENTION

Field of the Invention

The invention relates in general to a semiconductor package and a manufacturing method thereof, and more particularly to a semiconductor package with an antenna substrate and a manufacturing method thereof.

Description of the Related Art

Wireless communication devices, such as cell phones, typically include antennas for transmitting and receiving radio frequency (RF) signals. Conventionally, a wireless communication device includes an antenna layer and a communication module, wherein the antenna layer and the communication module are integrated together into a chip. However, when one portion of the chip, either the antenna portion or the communication module portion, is determined to be defective, the whole chip has to be discarded even if the other portion is working properly.

SUMMARY OF THE INVENTION

According to one aspect of this disclosure, a semiconductor package is provided. According to one embodiment, the semiconductor package includes: (1) a package substrate including an upper surface; (2) a semiconductor device disposed adjacent to the upper surface of the package substrate, the semiconductor device including an inactive surface; and (3) an antenna substrate disposed on the inactive surface of the semiconductor device.

According to another embodiment, the semiconductor package includes: (1) a package substrate including an upper surface; (2) a chip disposed adjacent to the upper surface of the package substrate; (3) a plurality of wires electrically connecting the chip with the package substrate; (4) an antenna substrate disposed on the chip; and (5) a spacer substrate disposed on the chip and between the antenna substrate and the package substrate to provide a space to accommodate the wires.

According to another embodiment, the semiconductor package includes: (1) a package substrate including an upper surface; (2) a semiconductor device disposed adjacent to the upper surface of the package substrate; (3) a passive component disposed adjacent to the upper surface of the package substrate; and (4) an antenna substrate disposed on the semiconductor device, the antenna substrate including a grounding layer covering the passive component.

BRIEF DESCRIPTION OF THE DRAWINGS

Common reference numerals are used throughout the drawings and the detailed description to indicate similar elements. Embodiments of this disclosure will be more apparent from the following detailed description taken in conjunction with the accompanying drawings.

DETAILED DESCRIPTION OF THE INVENTION

It is desirable to have the benefits of an integrated semiconductor package including an antenna portion and a communication module portion of a wireless communication device without having reduced yield resulting from their integration. Embodiments disclosed herein provide such an integrated semiconductor package.

Figure 1A:
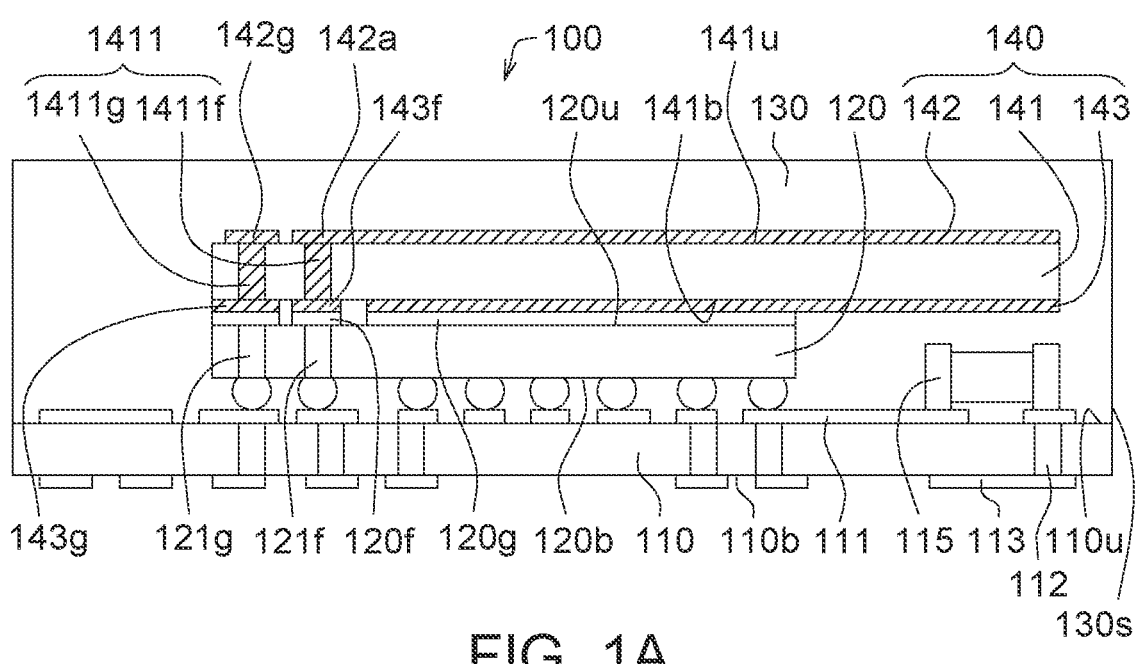
FIG. 1A and FIG. 1C illustrate a cross-sectional view of an example semiconductor package according to one embodiment.

Referring to FIG. 1A, a cross-sectional view of a semiconductor package according to one embodiment is illustrated. The semiconductor package 100 includes a package substrate 110, a passive component 115, a chip 120, a package body 130 and an antenna substrate 140.

The package substrate 110 has an upper surface 110u, a lower surface 110b opposite the upper surface 110u, a trace 111, a conductive via 112 and a plurality of pads 113. The trace 111 is formed on the upper surface 110u, the conductive via 112 is extended to the lower surface 110b from the upper surface 110u, and the pads 113 are formed on the lower surface 110b. The passive component 115 and the chip 120 may be electrically connected to the pads 113 through the conductive via 112. In addition, the package substrate 110 can be a multi-layered organic substrate or a ceramic substrate, for example.

The passive component 115 is disposed on the upper surface 110u of the package substrate 110 and electrically connected to the chip 120 through the trace 111. The passive component 115 may be, for example, a resistor, an inductor or a capacitor.

The chip 120 is disposed on the upper surface 110u of the package substrate 110. The chip 120 is coupled to the upper surface 110u of the package substrate 110 in a "face-down" orientation and electrically connected to the package substrate 110 via a plurality of solder balls. This configuration is sometimes referred to as "flip-chip". The chip 120 may be an active chip or SOC (system on chip). For example, the chip 120 may be a transceiver for transmitting radio frequency (RF) signals to the antenna substrate 140 and receiving RF signals from the antenna substrate 140.

The chip 120 includes an upper surface 120u and a feeding conductive via 121f. The chip 120 is part of a semiconductor device including a feeding layer 120f, formed on the upper surface 120u of the chip 120. The feeding layer 120f is electrically connected to the package substrate 110 through the feeding conductive via 121f. The semiconductor device further includes a grounding layer 120g formed on the upper surface 120u of the chip 120. The chip 120 includes a grounding conductive via 121g electrically connecting the grounding layer 120g and the package substrate 110. That is, the grounding layer 120g formed on the upper surface 120u of the chip 120 may be electrically connected to a ground potential through the grounding conductive via 121g. The grounding conductive via 121g and the feeding conductive via 121f may be implemented as through-silicon vias (TSV), for example.

The package body 130 encapsulates a portion of the upper surface 110u of the package substrate 110, the chip 120, and the antenna substrate 140. The package body 130 may include material such as novolac-based resin, epoxy-based resin, silicone-based resin or other suitable encapsulant. The package body 130 may also include suitable fillers such as powdered silicon dioxide. The package body 130 can be formed by various packaging technologies, such as, for example, compression molding, injection molding or transfer molding.

The antenna substrate 140 is disposed on the semiconductor device. In the illustrated embodiment, the antenna substrate 140 is directly disposed on the semiconductor device without an intervening layer, thereby reducing a signal transmission path and controlling electromagnetic interference (EMI). It is also contemplated that similar benefits can be attained by controlling a spacing between the antenna substrate 140 and the semiconductor device, such as to within about 500 μm, within about 400 μm, within about 300 μm, within about 200 μm, within about 100 μm, or with about 50 μm.

The antenna substrate 140 includes a core layer 141, an antenna layer 142 and a grounding layer 143. The core layer 141 includes an upper surface 141u, a lower surface 141b opposite the upper surface 141u, and at least one conductive via 1411. As illustrated in the embodiment of FIG. 1A, the at least one conductive via 1411 includes at least a feeding conductive via 1411f and a grounding conductive via 1411g. The core layer 141 may be a silicon substrate, an organic substrate, and a ceramic substrate, for example. The antenna layer 142 and the grounding layer 143 are respectively formed on the upper surface 141u and lower surface 141b of the core layer 141.

The grounding layer 143 includes a feeding portion 143f and a grounding portion 143g spaced and electrically isolated from the feeding portion 143f. The feeding portion 143f directly contacts the feeding layer 120f, and the feeding portion 143f is electrically connected to the feeding conductive via 121f The grounding portion 143g directly contacts the grounding layer 120g, and the grounding portion 143g is electrically connected to the ground potential through the grounding conductive via 121g.

The grounding layer 143 can serve as a shielding layer to protect electronic components below the grounding layer 143 from EMI caused by the antenna layer 142, since the grounding portion 143g of the grounding layer 143 is electrically connected to the ground potential. For example, in the embodiment of FIG. 1A, the grounding layer 143 of the antenna substrate 140 extends over the chip 120 and over the passive component 115 to protect the chip 120 and the passive component 115 from EMI. In another embodiment, the antenna substrate 140 may extend to a lateral surface of the package body 130, such as to lateral surface 130s, to overlap the whole upper surface 110u of the package substrate 110.

The antenna layer 142 is a patterned metal layer formed on the upper surface 141u of the core layer 141. The antenna layer 142 includes a grounding portion 142g and an antenna portion 142a spaced and electrically isolated from the grounding portion 142g. The antenna portion 142a is electrically connected to the feeding portion 143f of the grounding layer 143 through the feeding conductive via 1411f, and the grounding portion 142g is electrically connected to the grounding portion 143g of the grounding layer 143 through the grounding conductive via 1411g.

The antenna substrate 140 converts electric power into radio waves, and vice versa. In transmission, the chip 120 functioning as a radio transmitter supplies an oscillating radio frequency electric current to the antenna layer 142 through the feeding conductive via 121f, the feeding layer 120f, the feeding portion 143f, and the feeding conductive via 1411f, and the antenna layer 142 radiates the energy from the current as electromagnetic waves. In reception, the antenna layer 142 intercepts the power of electromagnetic waves to produce a voltage applied to the chip 120 functioning as a radio receiver, through the feeding conductive via 1411f, the feeding portion 143f, the feeding layer 120f and the feeding conductive via 121f. The RF signal path is reduced by directly coupling the feeding conductive via 1411f of the antenna substrate 140 to the feeding conductive via 121f of the chip 120, and the RF signal attenuation is accordingly reduced.

As illustrated in FIG. 1A, the antenna layer 142 is encapsulated by the package body 130. However, in another embodiment, the antenna layer 142 may be exposed from the package body 130, as shown in FIG. 1C and FIG. 3B for another embodiment. In addition, the antenna substrate 140, which passes the quality test and is a known good antenna substrate (i.e., a working antenna substrate), is disposed on the chip 120 to form the semiconductor package 100. As a result, a defective antenna substrate can be found before being disposed on the chip 120, thus yield is improved and cost is reduced.

Figure 1B:
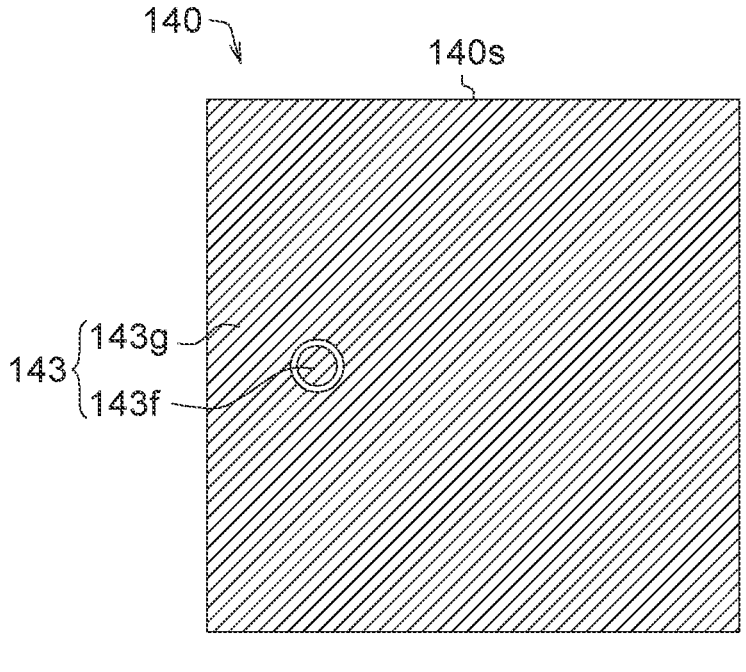
FIG. 1B illustrates a bottom view of an example antenna substrate.
Figure 1C:
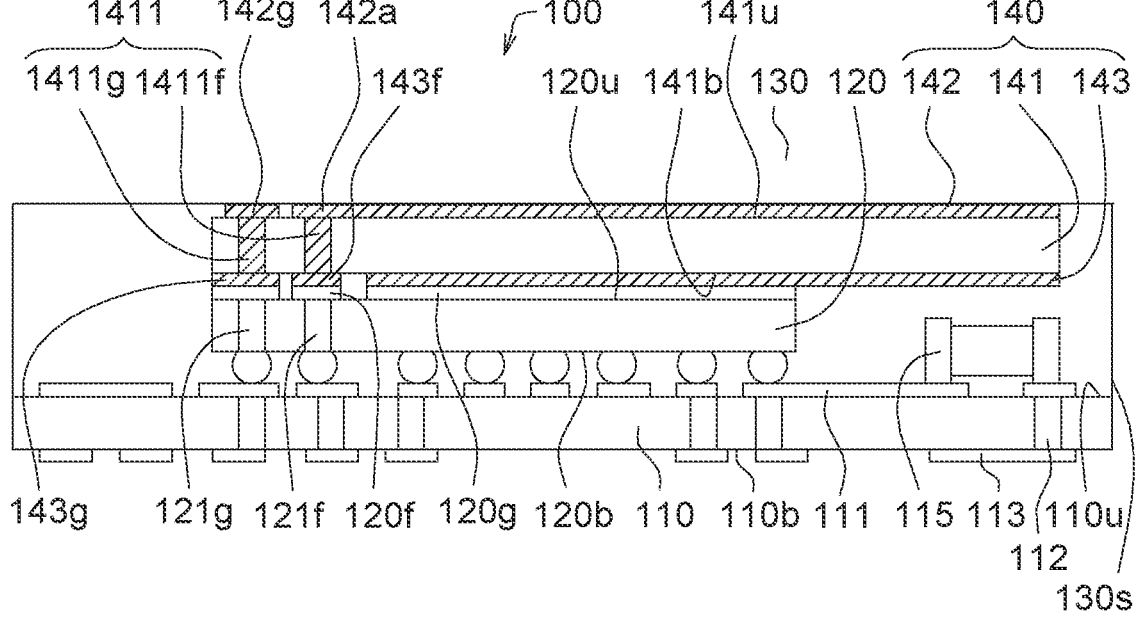

Referring to FIG. 1B, a bottom view of the antenna substrate 140 of FIG. 1A is illustrated. The grounding portion 143g, which is spaced and electrically isolated from the feeding portion 143f, surrounds the feeding portion 143f Moreover, the grounding portion 143g is extended to a lateral surface 140s of the antenna substrate 140 to obtain the broadest shielding area.

Figure 2A:
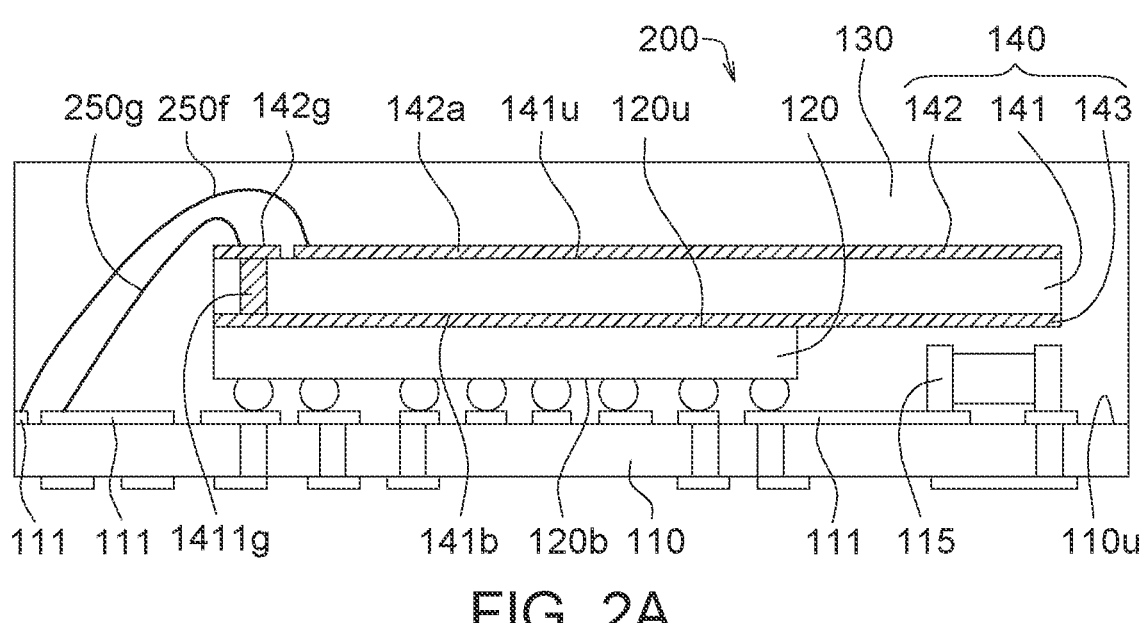
FIG. 2A illustrates a cross-sectional view of an example semiconductor package according to another embodiment.

Referring to FIG. 2A, a cross-sectional view of a semiconductor package 200 according to another embodiment is illustrated. The semiconductor package 200 includes the package substrate 110, the passive component 115, the chip 120, the package body 130, the antenna substrate 140, a grounding wire 250g and a feeding wire 250f.

The chip 120 is disposed on the upper surface 110u of the package substrate 110. The chip 120 includes the upper surface 120u, and an active surface 120b opposite to the upper surface 120u. The upper surface 120u facing toward the antenna substrate 140 is an inactive surface. The active surface 120b faces toward the package substrate 110 and is electrically connected to the package substrate 110 via a plurality of solder balls.

The package body 130 encapsulates the chip 120, the antenna substrate 140 and the grounding wire 250g and the feeding wire 250f.

The antenna substrate 140 is directly disposed on the chip 120 and includes the core layer 141, the antenna layer 142 and the grounding layer 143. The core layer 141 includes the upper surface 141u, the lower surface 141b opposite to the upper surface 141u and the grounding conductive via 1411g. The antenna layer 142 is formed on the upper surface 141u of the core layer 141, and the grounding layer 143 is formed on the lower surface 141b of the core layer 141 and directly contacts the upper surface 120u of the chip 120.

The antenna layer 142 of the antenna substrate 140 includes the grounding portion 142g and the antenna portion 142a, wherein the grounding portion 142g is electrically connected to the package substrate 110 through the grounding wire 250g, and the antenna portion 142a is electrically connected to the package substrate 110 through the feeding wire 250f. The grounding layer 143 is electrically connected to the grounding portion 142g of the antenna layer 142 through the grounding conductive via 1411g. Accordingly, the grounding layer 143 is electrically connected to the ground potential through the grounding conductive via 1411g, the grounding portion 142g and the grounding wire 250g. Through a trace 111 of the package substrate 110 and the feeding wire 250f, an RF signal is transmitted from the antenna substrate 140 to the chip 120.

Figure 2B:
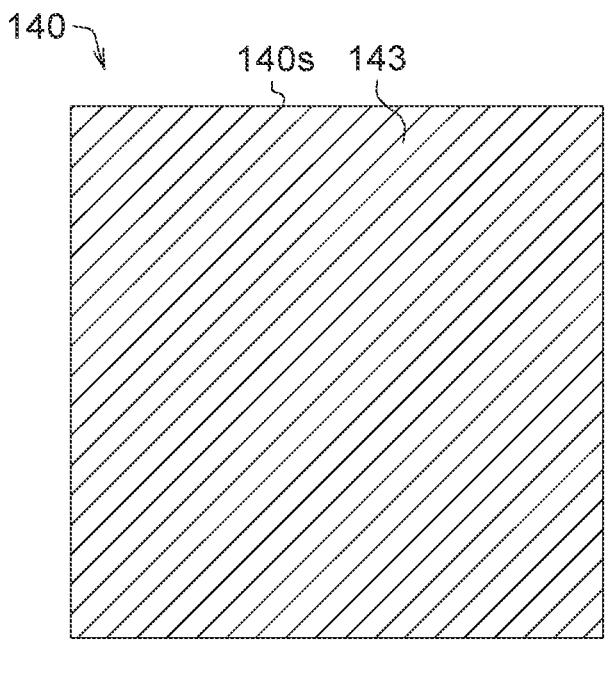
FIG. 2B illustrates a bottom view of another example antenna substrate.

Referring to FIG. 2B, a bottom view of the antenna substrate of FIG. 2A is illustrated. The grounding layer 143 covers the entire lower surface 141b (illustrated in FIG. 2A) of the core layer 141, that is, the grounding layer 143 is a continuous metal layer without any hollow pattern. The bottom view shown is intended to be an example and not limiting. In another embodiment, the grounding layer 143 can be a patterned grounding layer, or can cover at least about 70%, at least about 80%, at least about 90%, or at least about 95% of the lower surface 141b. In addition, the grounding layer 143 may be extended to at least one of the lateral surfaces 140s of the antenna substrate 140 to obtain the broadest shielding area.

Figure 3A:
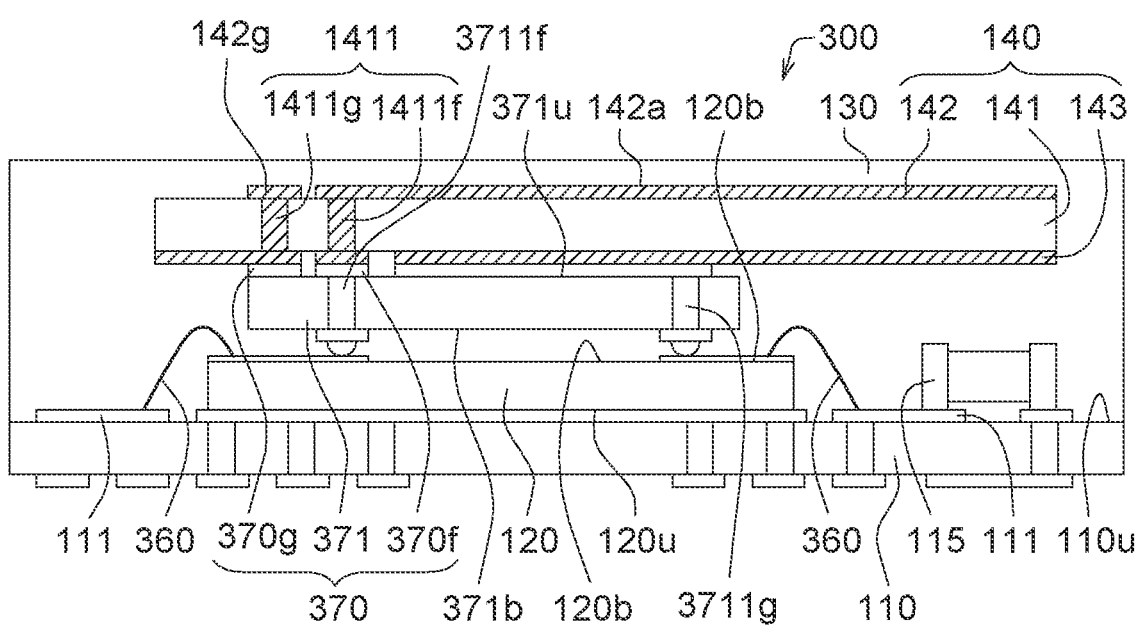
FIG. 3A and FIG. 3B illustrate a cross-sectional view of an example semiconductor package according to another embodiment.
Figure 3B:
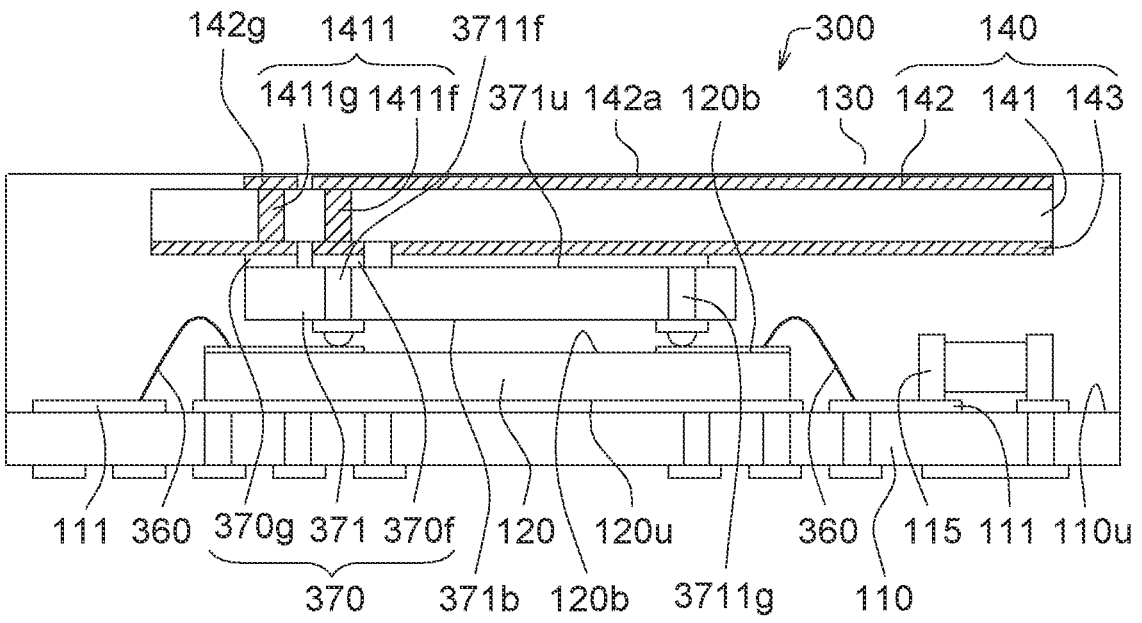

Referring to FIG. 3A, a cross-sectional view of a semiconductor package 300 according to another embodiment is illustrated. The semiconductor package 300 includes the package substrate 110, the passive component 115, the chip 120, the package body 130, the antenna substrate 140, at least one conductive bond wire 360 and a spacer substrate 370.

The chip 120 may be coupled to the package substrate 110 in a "face-up" orientation, and electrically connected to the package substrate 110 via a plurality of conductive bond wires 360. The chip 120 includes the lower surface 120u facing toward the package substrate 110 and the active surface 120b facing toward the spacer substrate 370.

The antenna substrate 140 includes the core layer 141, the antenna layer 142 and the grounding layer 143. In the present embodiment, the structure of the grounding layer 143 is similar to that illustrated in FIG. 1, and the similarities are not repeated here.

The spacer substrate 370 is an interposer substrate disposed between the chip 120 and the antenna substrate 140 to provide a space to accommodate the conductive bond wires 360, thus avoiding electrical connection of the conductive bond wires 360 to the grounding layer 143 of the antenna substrate 140. In the illustrated embodiment, the antenna substrate 140 is directly disposed on the spacer substrate 370, and the spacer substrate 370 is directly disposed on chip 120, thereby reducing a signal transmission path and controlling EMI. It is also contemplated that similar benefits can be obtained by controlling a spacing between the antenna substrate 140 and the spacer substrate 370 or a spacing between the spacer substrate 370 and the chip 120, such as to within about 500 μm, within about 400 μm, within about 300 μm, within about 200 μm, within about 100 μm, or with about 50 μm.

The spacer substrate 370 is directly coupled to the chip 120 in a "face-down" orientation and electrically connected to the chip 120 via a plurality of solder balls. The spacer substrate 370 includes a base 371, a feeding layer 370f and a grounding layer 370g. The base 371 includes an upper surface 371u and a lower surface 371b, and the feeding layer 370f and the grounding layer 370g are formed on the upper surface 371u. The base 371 further includes a feeding conductive via 3711f and a grounding conductive via 3711g, wherein the feeding conductive via 3711f electrically connects the feeding layer 370f and the chip 120, and the grounding conductive via 3711g electrically connects the grounding layer 370g and the chip 120.

Figure 4:
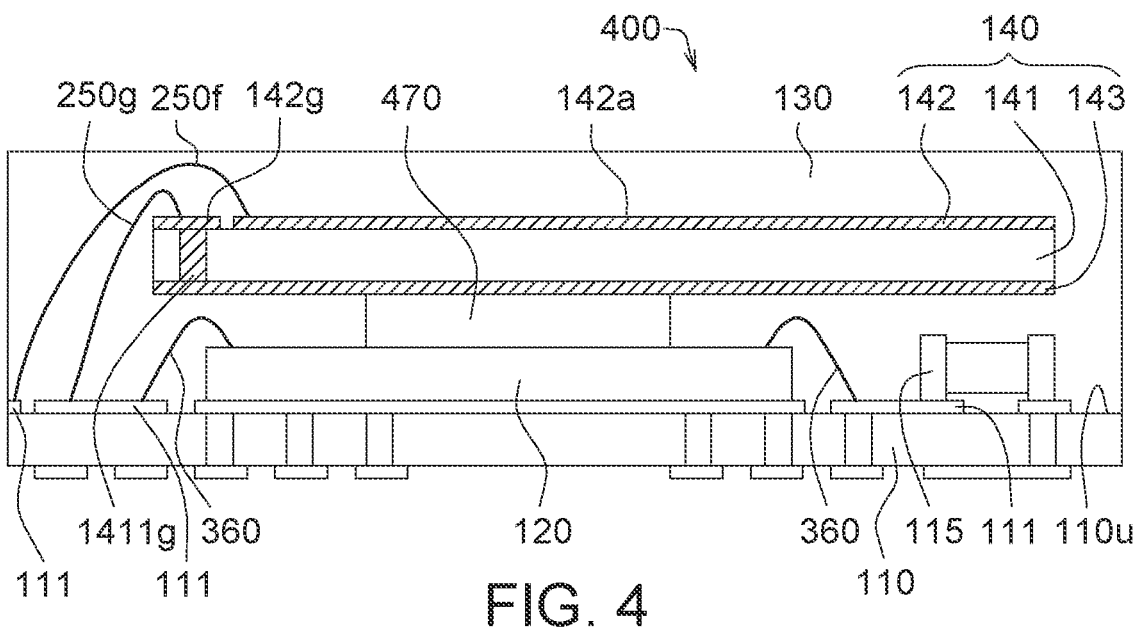
FIG. 4 illustrates a cross-sectional view of an example semiconductor package according to another embodiment.

Referring to FIG. 4, a cross-sectional view of a semiconductor package 400 according to another embodiment is illustrated. The semiconductor package 400 includes the package substrate 110, the passive component 115, the chip 120, the package body 130, the antenna substrate 140, the feeding wire 250f, the grounding wire 250g, at least one conductive bond wire 360 and a spacer substrate 470.

The antenna substrate 140 includes the core layer 141, the antenna layer 142 and the grounding layer 143. In the present embodiment, the structure of the antenna substrate 140 is similar to that illustrated in FIG. 2, and the similarities are not repeated here.

The feeding wire 250f can be electrically connected to the chip 120 and the trace 111 of the package substrate 110, such that an RF signal is transmitted from the antenna substrate 140 to the chip 120 through the trace 111 of the package substrate 110 and the feeding wire 250f. The grounding portion 142g can be electrically connected to the ground potential through the grounding wire 250g and the trace 111 of the package substrate 110. Since the antenna substrate 140 can be electrically connected to the package substrate 110 through the grounding wire 250g and the feeding wire 250f, conductive elements such as vias or traces may be omitted in the spacer substrate 470.

The spacer substrate 470 is an insulation substrate, which is formed of a material including silicon or glass, for example. The spacer substrate 470 is directly disposed on the chip 120 and has an upper surface 470u. The antenna substrate 140 is directly disposed on the upper surface 470u of the spacer substrate 470.

Referring to FIGS. 5A-5E, manufacturing processes according to the semiconductor package of FIG. 1A are illustrated.

Figure 5A:
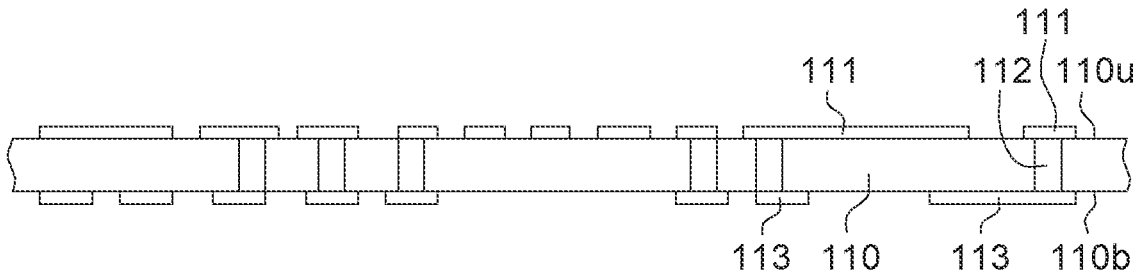
FIG. 5A, FIG. 5B, FIG. 5C, FIG. 5D, and FIG. 5E illustrate an example manufacturing process.

Referring to FIG. 5A, the package substrate 110 is provided, wherein the package substrate 110 includes the upper surface 110u, the lower surface 110b, a plurality of the traces 111, a plurality of the conductive vias 112 and a plurality of the pads 113. The traces 111 are formed on the upper surface 110u, the conductive vias 112 extend to the lower surface 110b from the upper surface 110u, and the pads 113 are formed on the lower surface 110b. The pads 113 are electrically connected to the traces 111 through the conductive vias 112.

Figure 5B:
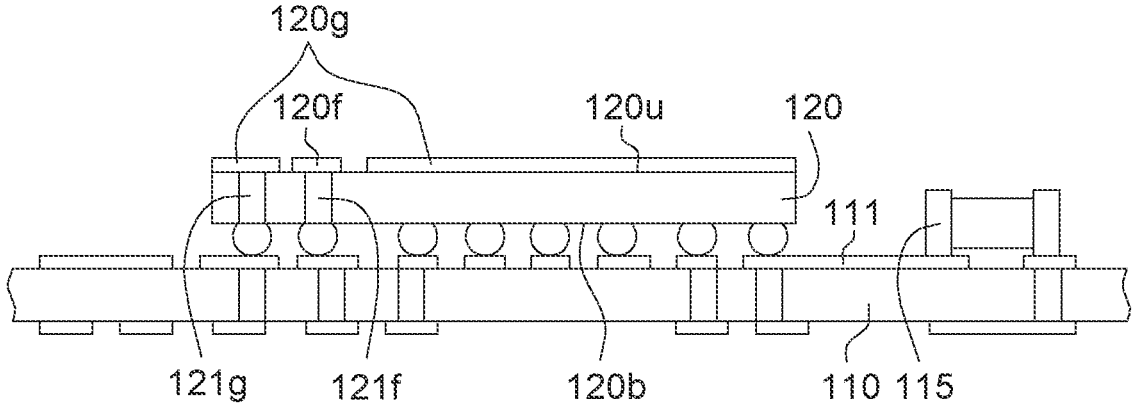

Referring to FIG. 5B, the passive component 115 and the chip 120 are disposed on the upper surface 110u of the package substrate 110. The chip 120 is coupled to the upper surface 110u of the package substrate 110 in a "face-down" orientation and electrically connected to the package substrate 110 via a plurality of solder balls. The chip 120 includes the upper surface 120u, and is part of a semiconductor device that includes the feeding layer 120f and the feeding conductive via 121f, wherein the feeding layer 120f is formed on the upper surface 120u of the chip 120, and the feeding conductive via 121f electrically connects the feeding layer 120f and the package substrate 110.

Figure 5C:
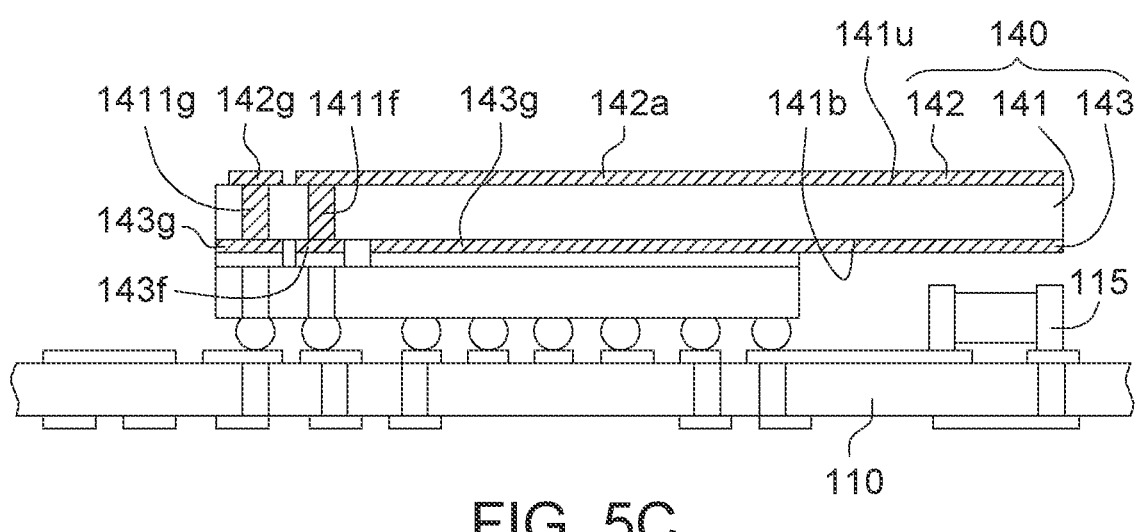

Referring to FIG. 5C, the antenna substrate 140 is disposed on the chip 120 using, for example, surface mount technology (SMT). The antenna substrate 140, which passes the quality test and is a known good antenna substrate (i.e., a working substrate), is disposed on the chip 120. As a result, yield is improved and cost is reduced. In the illustration, the antenna substrate 140 extends horizontally to overlap the passive component 115.

The antenna substrate 140 includes the core layer 141, the antenna layer 142 and the grounding layer 143. The core layer 141 includes the upper surface 141*u*, the lower surface 141*b*, the grounding conductive via 1411*g* and the feeding conductive via 1411*f*. The antenna layer 142 is formed on the upper surface 141*u* of the core layer 141, and the grounding layer 143 is formed on the lower surface 141*b* of the core layer 141. The antenna layer 142 includes the antenna portion 142*a* and the grounding portion 142*g* spaced and electrically isolated from the antenna portion 142*a*, and the grounding layer 143 includes the grounding portion 143*g* and the feeding portion 143*f* spaced and electrically isolated from the grounding portion 143*g*. The antenna portion 142*a* is electrically connected to the feeding portion 143*f* through the feeding conductive via 1411*f*, and the grounding portion 142*g* is electrically connected to the grounding portion 143*g* through grounding conductive via 1411*g*.

Figure 5D:
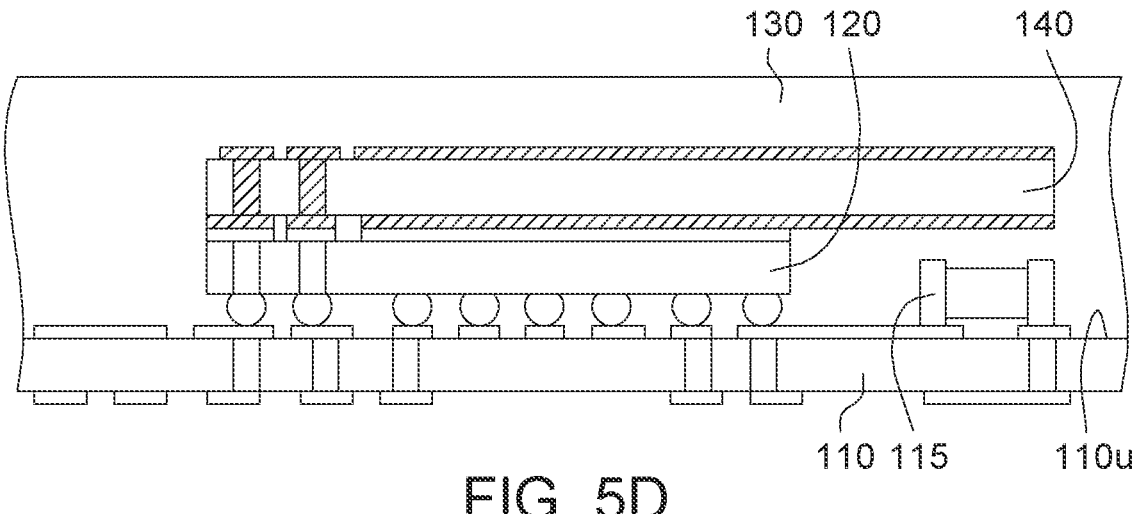

Referring to FIG. 5D, the package body 130 is formed on the upper surface 110*u* of the package substrate 110, encapsulating the passive element 115, the chip 120 and the antenna substrate 140.

Figure 5E:
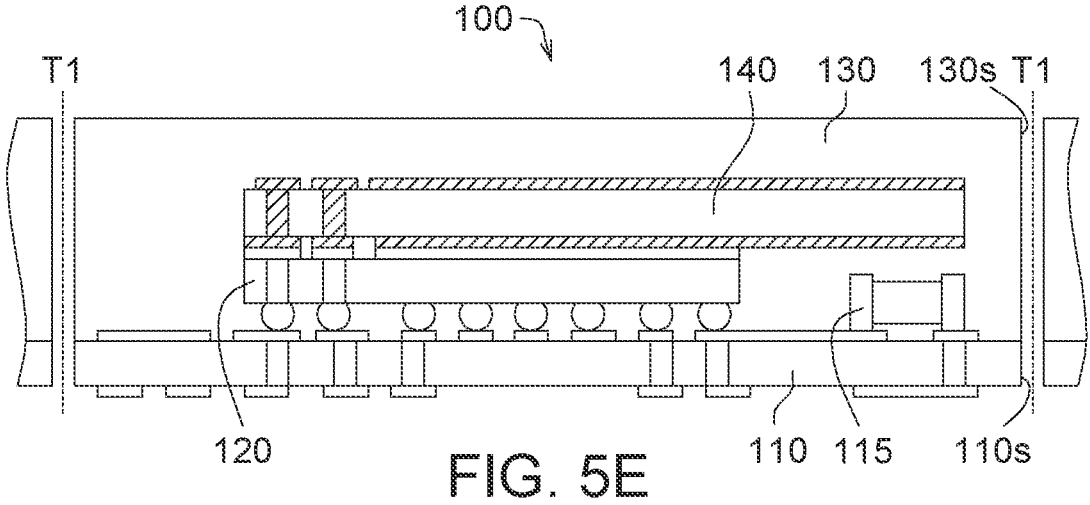

Referring to FIG. 5E, a number of singulation paths T1 are formed passing through the package body 130 and the package substrate 110 to form the semiconductor package 100. The singulation paths T1 are formed using a laser or another cutting tool. The lateral surfaces 130*s* of the package body 130 and the lateral surface 110*s* of the package substrate 110 are formed by the singulation. The lateral surface 130*s* is flush with the lateral surface 110*s*. In the present embodiment, the singulation method is a "full-cut method", that is, the singulation paths T1 cut fully through the package substrate 110 and the package body 130. In another embodiment, the package body 130 and the package substrate 110 can be singulated using a "half-cut method", that is, the singulation paths T1 cut through a portion of the package substrate 110 or a portion of the package body 130.

The method of forming the semiconductor package 200 is similar to that of forming the semiconductor package 100 of FIG. 1A, and the similarities are not repeated here.

Referring to FIGS. 6A-6E, manufacturing processes according to the semiconductor package of FIG. 3 are illustrated.

Figure 6A:
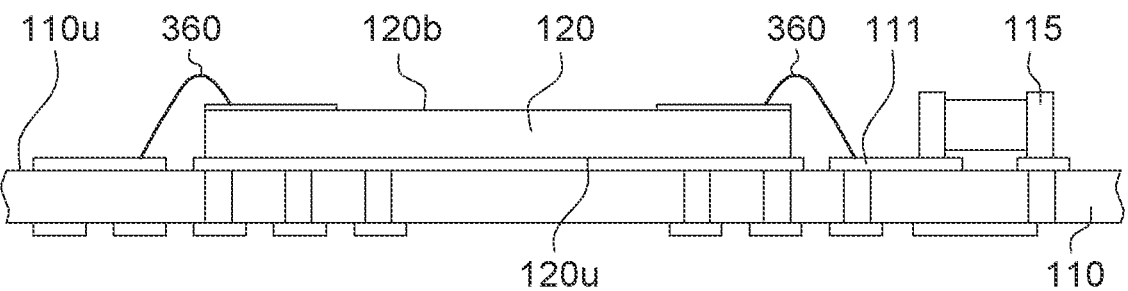
FIG. 6A, FIG. 6B, FIG. 6C, FIG. 6D, and FIG. 6E illustrate an example manufacturing process.

Referring to FIG. 6A, the passive component 115 and the chip 120 are disposed on the upper surface 110*u* of the package substrate 110. The chip 120 is coupled to the upper surface 110*u* of the package substrate 110 in a "face-up" orientation and electrically connected to the package substrate 110 via a plurality of conductive bond wires 360.

Figure 6B:
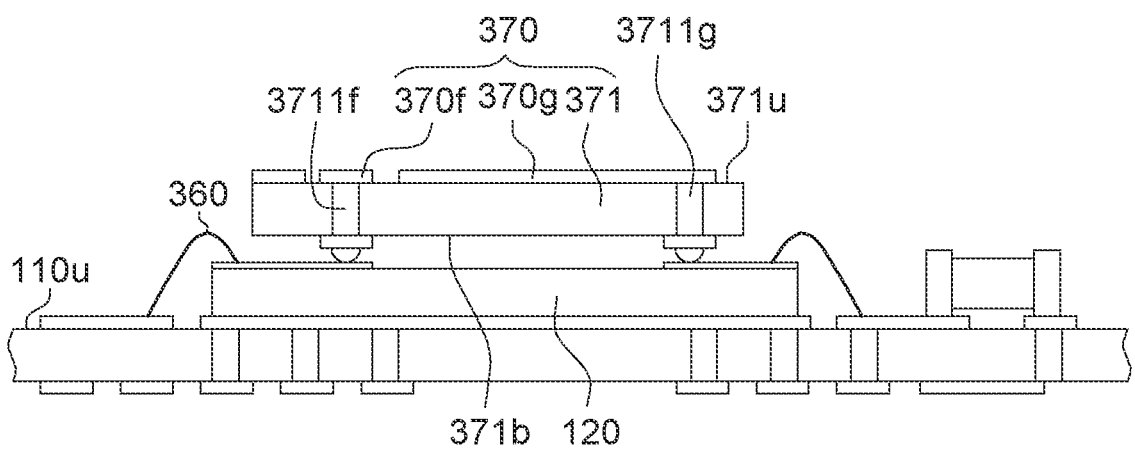

Referring to FIG. 6B, the spacer substrate 370 is disposed on the chip 120. The spacer substrate 370 is directly coupled to the chip 120 in a "face-down" orientation and electrically connected to the chip 120 via a plurality of solder balls. The spacer substrate 370 includes the base 371, the feeding layer 370*f* and the grounding layer 370*g*. The base 371 includes the upper surface 371*u* and the lower surface 371*b*, wherein the feeding layer 370*f* and the grounding layer 370*g* are formed on the upper surface 371*u*. The base 371 further includes a feeding conductive via 3711*f* and the grounding conductive via 3711*g*, wherein the feeding conductive via 3711*f* electrically connects the feeding layer 370*f* and the chip 120, and the grounding conductive via 3711*g* electrically connects the grounding layer 370*g* and the chip 120.

Figure 6C:
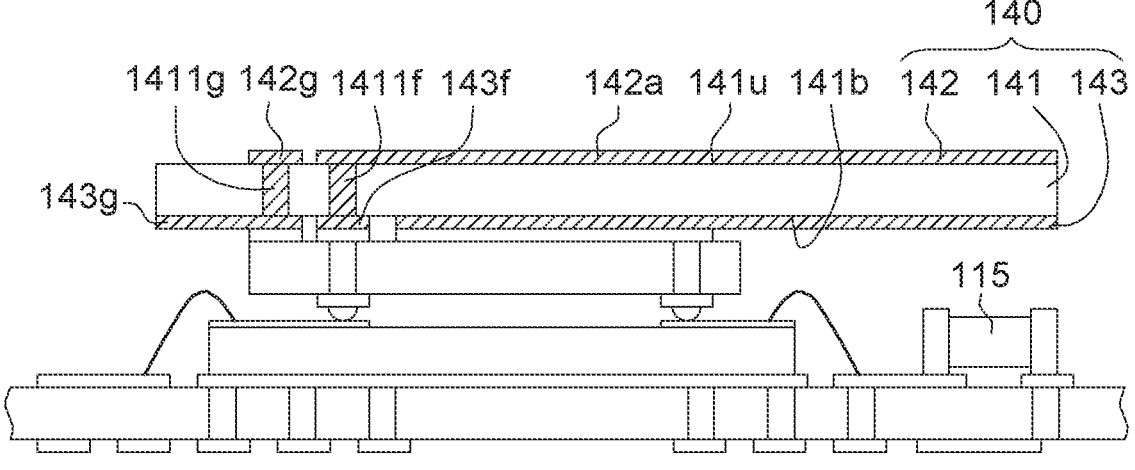

Referring to FIG. 6C, the antenna substrate 140 is disposed on the spacer substrate 370 using, for example, SMT. The antenna substrate 140, which passes the quality test and is a known good antenna substrate (i.e., a working antenna substrate), is disposed on the spacer substrate 370. In the illustration, the antenna substrate 140 extends horizontally to overlap the passive component 115.

The antenna substrate 140 includes the core layer 141, the antenna layer 142 and the grounding layer 143, wherein the core layer 141 includes the upper surface 141*u*, the lower surface 141*b*, the grounding conductive via 1411*g* and the feeding conductive via 1411*f* The antenna layer 142 is formed on the upper surface 141*u* of the core layer 141, and the grounding layer 143 is formed on the lower surface 141*b* of the core layer 141. The antenna layer 142 includes the antenna portion 142*a* and the grounding portion 142*g* spaced and electrically isolated from the antenna portion 142*a*. The grounding layer 143 includes the grounding portion 143*g* and the feeding portion 143*f* spaced and electrically isolated from the grounding portion 143*g*. The grounding portion 143*g* is electrically connected to the grounding portion 142*g* through the grounding conductive via 1411*g*, and the feeding portion 143*f* is electrically connected to the antenna portion 142*a* through the feeding conductive via 1411*f*.

Figure 6D:
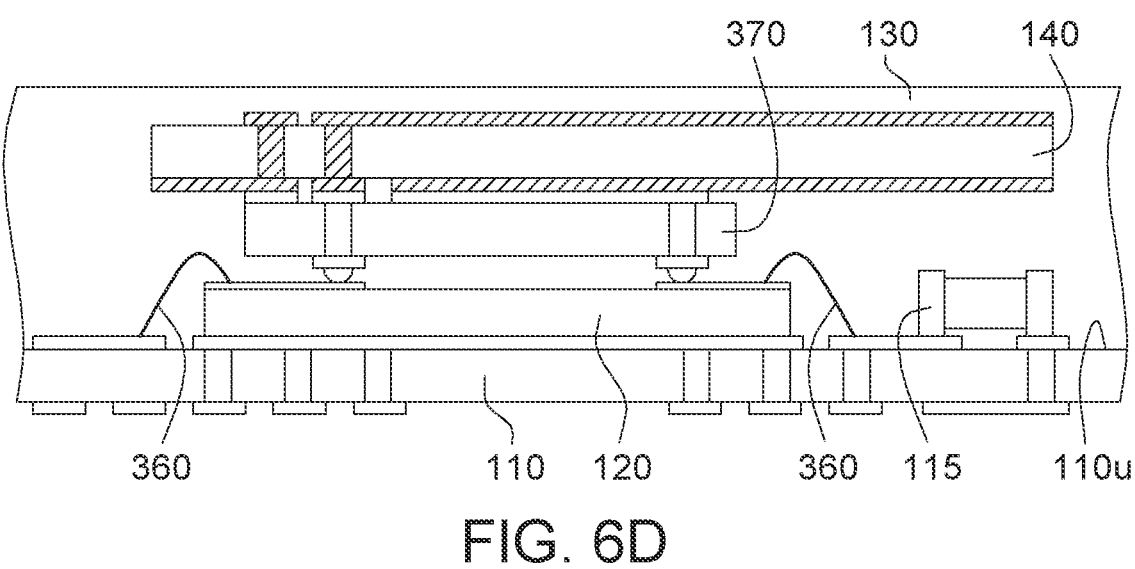

Referring to FIG. 6D, the package body 130 is formed on the upper surface 110*u* of the package substrate 110, encapsulating the passive component 115, the chip 120, the antenna substrate 140 and the conductive bond wires 360.

Figure 6E:
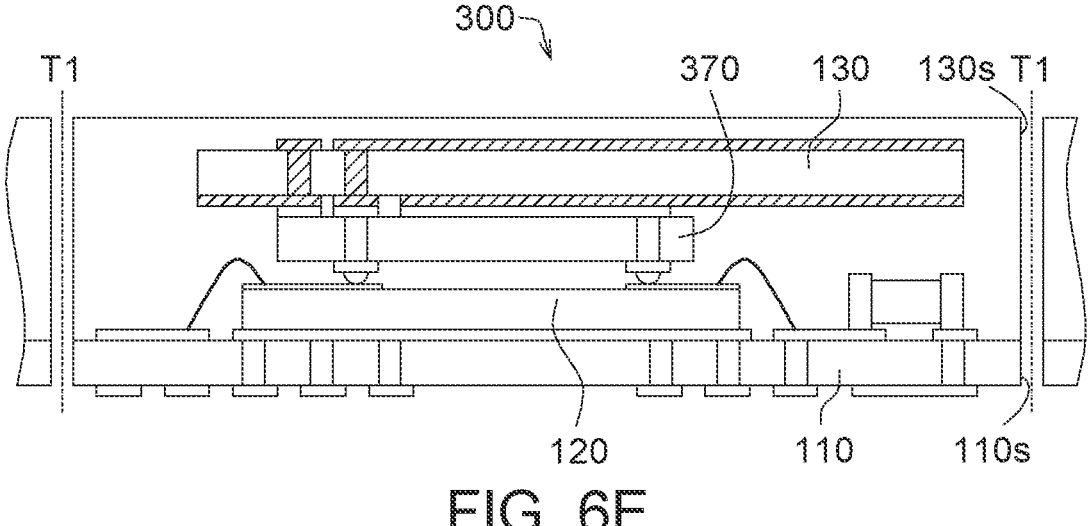

Referring to FIG. 6E, a number of singulation paths T1 passing through the package body 130 and the package substrate 110 are formed to form the semiconductor package 300. The singulation paths T1 are formed using a laser or another cutting tool. The lateral surface 130*s* of the package body 130 and the lateral surface 110*s* of the package substrate 110 are formed, such that the lateral surface 130*s* is flush with the lateral surface 110*s*. In the present embodiment, the singulation method is a "full-cut method", that is, the singulation paths T1 cut fully through the package substrate 110 and the package body 130.

The method of forming the semiconductor package 400 is similar to that of forming the semiconductor package 400 of FIG. 4, and the similarities are not repeated here.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention.

Accordingly, unless specifically indicated herein, the order and grouping of the operations are not limitations of the invention.

What is claimed is:

1. A semiconductor package comprising:
a circuit structure;
a chip disposed adjacent to the circuit structure and electrically connected to the circuit structure through a connection element;
an antenna electrically connected to the chip; and
a spacer disposed between the antenna and the circuit structure, wherein the spacer is spaced apart from the connection element by a gap.

2. The semiconductor package as claimed in claim 1, wherein the chip has an active surface facing the antenna.

3. The semiconductor package as claimed in claim 2, wherein the chip has a second surface opposite to the active surface, and the active surface is closer to the spacer than the second surface is.

4. The semiconductor package as claimed in claim 1, wherein the antenna comprises a conductive layer, and the conductive layer comprises a grounding portion and a feeding portion.

5. The semiconductor package as claimed in claim 4, wherein the grounding portion is disposed adjacent to at least two lateral sides of the feeding portion.

6. The semiconductor package as claimed in claim 4, further comprising a ground potential layer electrically connected to the ground portion of the conductive layer of the antenna.

7. The semiconductor package as claimed in claim 6, wherein the ground potential layer is closer to the circuit structure than the antenna.

8. The semiconductor package as claimed in claim 6, further comprising an encapsulant encapsulating the chip.

9. The semiconductor package as claimed in claim 4, further comprising a passive component disposed adjacent to the ground portion of the conductive layer, wherein the ground portion of the conductive layer is configured to shield the passive component from electromagnetic interference (EMI).

10. The semiconductor package as claimed in claim 1, further comprising a passive component adjacent to the circuit structure.

11. The semiconductor package as claimed in claim 10, wherein the chip is electrically connected to the passive component through a trace of the circuit structure.

12. The semiconductor package as claimed in claim 1, wherein the antenna has a first side and a second side, the circuit structure has a third side adjacent to the first side and a fourth side adjacent to the second side, and a distance between the first side and the third side is greater than a distance between the second side and the fourth side.

13. The semiconductor package as claimed in claim 1, further comprising a solder disposed between the antenna and the circuit structure, and electrically connecting the antenna and the chip.

14. The semiconductor package as claimed in claim 1, wherein a thickness of the antenna is greater than a thickness of the chip.

15. The semiconductor package as claimed in claim 1, wherein the antenna comprises:
a core layer;
an antenna layer adjacent to the core layer; and
a conductive via penetrating the core layer and electrically connecting the antenna layer with the chip.

16. The semiconductor package as claimed in claim 15, wherein the circuit structure comprises a conductive via substantially overlapping the conductive via of the antenna.

17. The semiconductor package as claimed in claim 15, wherein the antenna layer is a patterned metal layer.

18. The semiconductor package as claimed in claim 1, wherein the spacer is configured to transmit an RF signal between the circuit structure and the antenna.

19. The semiconductor package as claimed in claim 1, wherein a lateral side of the antenna is misaligned with a lateral side of the circuit structure.

20. The semiconductor package as claimed in claim 1, wherein the spacer is configured to support the antenna.

* * * * *